(12) United States Patent
Moriai

(10) Patent No.: US 10,374,615 B2
(45) Date of Patent: Aug. 6, 2019

(54) TRANSMISSION CIRCUIT AND INTEGRATED CIRCUIT

(71) Applicant: Socionext Inc., Yokohama-shi, Kanagawa (JP)

(72) Inventor: Taro Moriai, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/899,556

(22) Filed: Feb. 20, 2018

(65) Prior Publication Data

US 2018/0248557 A1 Aug. 30, 2018

(30) Foreign Application Priority Data

Feb. 24, 2017 (JP) .................................. 2017-033300

(51) Int. Cl.
| | |
|---|---|
| *H04L 7/00* | (2006.01) |
| *H04L 7/10* | (2006.01) |
| *G06F 11/10* | (2006.01) |
| *H03L 7/081* | (2006.01) |
| *H03L 7/085* | (2006.01) |
| *H03L 7/087* | (2006.01) |

(52) U.S. Cl.
CPC ........ *H03L 7/0814* (2013.01); *G06F 11/1004* (2013.01); *H03L 7/085* (2013.01); *H03L 7/087* (2013.01); *H04L 7/0008* (2013.01); *H04L 7/0091* (2013.01); *H04L 7/10* (2013.01); *G06F 2213/0038* (2013.01)

(58) Field of Classification Search
CPC .. G06F 11/00; G06F 11/1004; G06F 2213/00; G06F 2213/0038; H03L 7/00; H03L 7/0814; H03L 7/087; H03L 7/0891; H03L 7/093; H03L 7/10; H03L 7/18; H04L 7/00; H04L 7/0008; H04L 7/0091; H04L 7/10
USPC ........................................................ 327/156
See application file for complete search history.

(56) References Cited

U.S. PATENT DOCUMENTS

| | | | |
|---|---|---|---|
| 2004/0252802 A1* | 12/2004 | Yamaguchi ........ | G01R 31/3016 375/371 |
| 2011/0093753 A1 | 4/2011 | Takagi | |
| 2011/0317747 A1 | 12/2011 | Ozawa et al. | |

(Continued)

FOREIGN PATENT DOCUMENTS

| | | |
|---|---|---|
| JP | 2011-090361 A | 5/2011 |
| JP | 2011-091745 A | 5/2011 |

*Primary Examiner* — Lincoln D Donovan
*Assistant Examiner* — Dave Mattison
(74) *Attorney, Agent, or Firm* — Arent Fox LLP

(57) ABSTRACT

A transmission circuit includes: a clock generating circuit configured to generate a first clock signal and a second clock signal whose frequency is lower than a frequency of the first clock signal; a first conversion circuit configured to convert, based on the second clock signal, input data into intermediate data whose bit width is narrower than a bit width of the input data; a second conversion circuit configured to convert, based on the first clock signal, the intermediate data into output data whose bit width is narrower than the bit width of the intermediate data; capture circuits configured to sequentially capture a data sequence of the output data; an analysis circuit configured to perform an analysis on the captured data sequence; and a phase adjusting circuit configured to adjust a phase of the second clock signal based on a result of the analysis.

16 Claims, 11 Drawing Sheets

(56) References Cited

U.S. PATENT DOCUMENTS

2014/0226771 A1\* 8/2014 Arima .................. H04L 7/0337
                                                               375/373
2017/0244426 A1\* 8/2017 Ogata ..................... H03M 9/00

\* cited by examiner

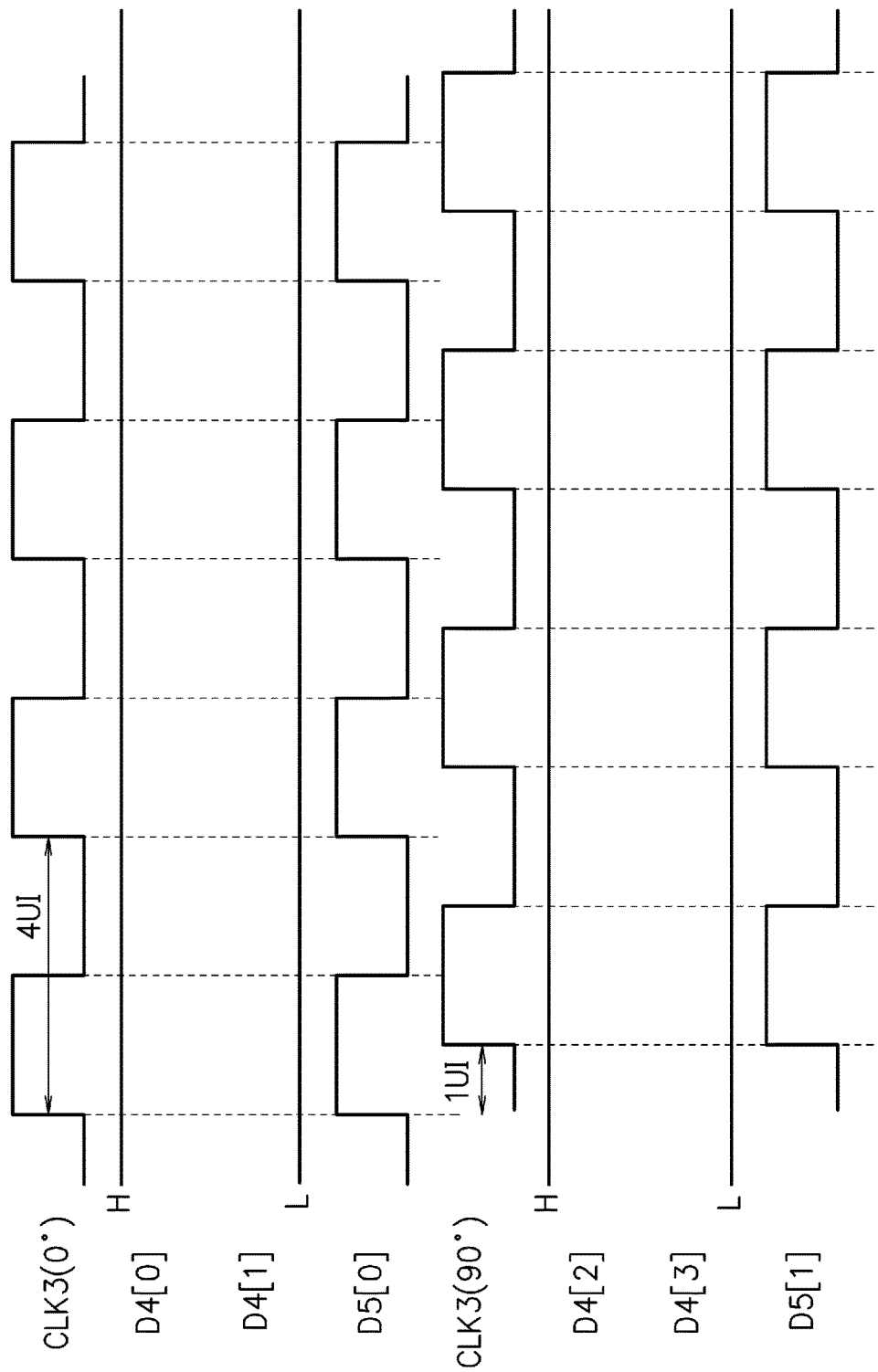

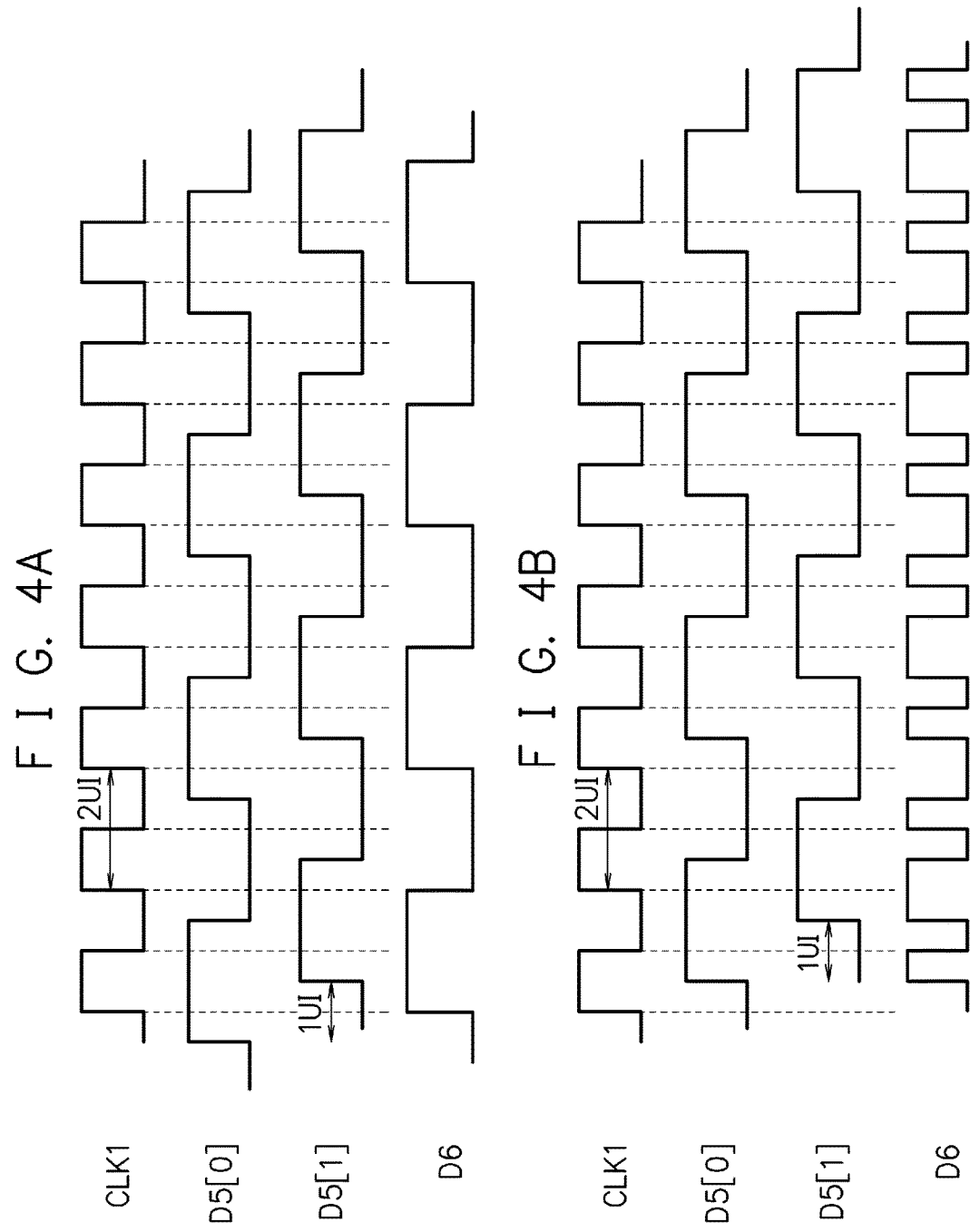

F I G. 8
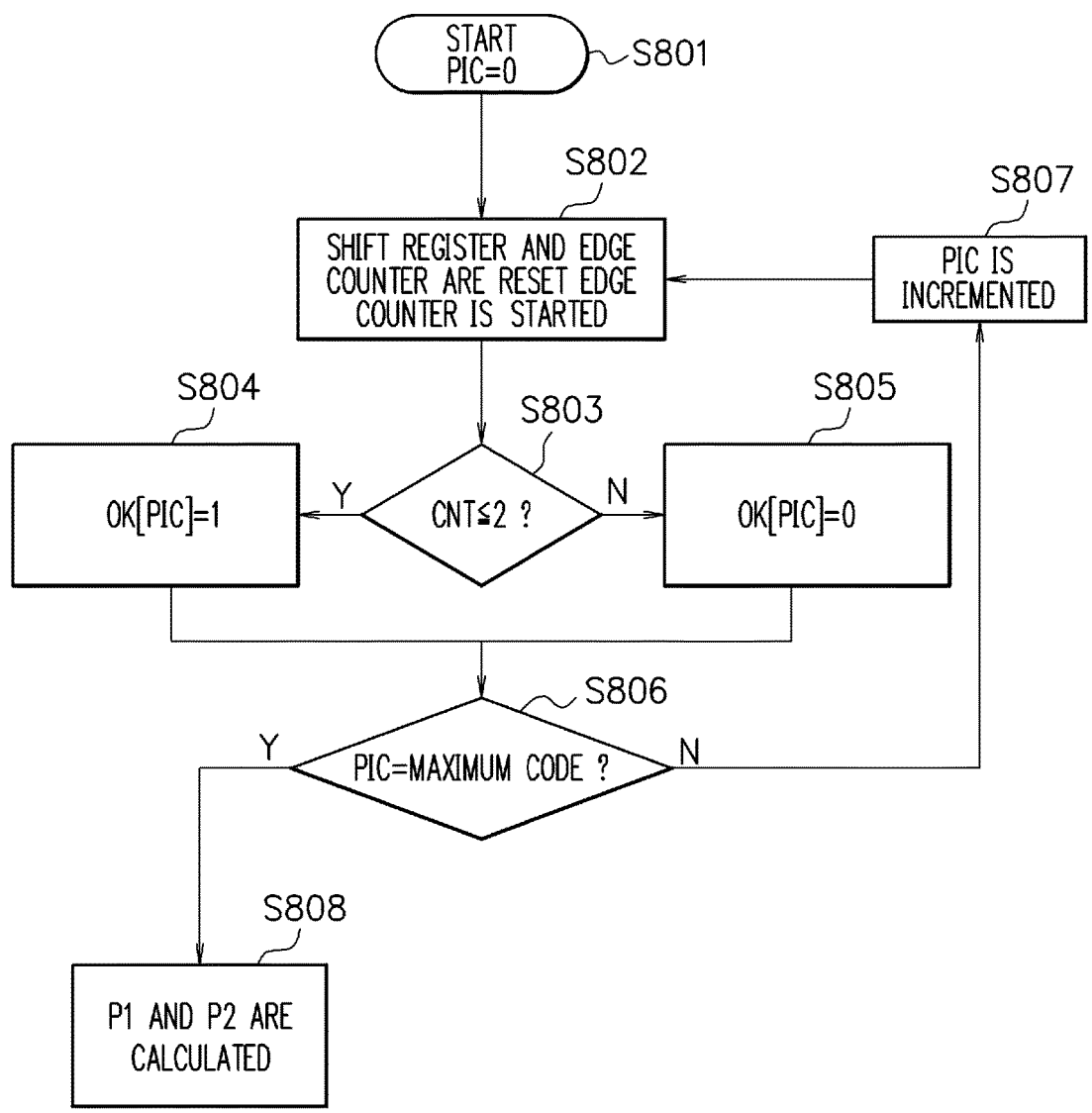

TRANSMISSION CIRCUIT AND INTEGRATED CIRCUIT

CROSS-REFERENCE TO RELATED APPLICATION

This application is based upon and claims the benefit of priority of the prior Japanese Patent Application No. 2017-033300, filed on Feb. 24, 2017, the entire contents of which are incorporated herein by reference.

FIELD

The embodiments discussed herein are directed to a transmission circuit and an integrated circuit.

BACKGROUND

There has been known a phase calibration circuit which uses a data block including a data body and detection information for detecting an error, and acquires the data block transferred by using a reference clock signal (refer to Patent Document 1). A reception clock generating unit generates a plurality of clock signals including at least a first clock signal whose phase is shifted with respect to the reference clock signal, a second clock signal whose phase is advanced with respect to the first clock signal, and a third clock signal whose phase is delayed with respect to the first clock signal. A determination unit acquires the data block in accordance with the plurality of clock signals, and determines whether or not a read error is occurred, by using the detection information. Subsequently, the determination unit outputs a plurality of determination results including at least a first determination result obtained by determining the data block acquired in accordance with the first clock signal, a second determination result obtained by determining the data block acquired in accordance with the second clock signal, and a third determination result obtained by determining the data block acquired in accordance with the third clock signal. A phase adjusting unit instructs the reception clock generating unit to adjust the phase of the first clock signal, according to the plurality of determination results.

There has been known a transmitting device which transmits data and a clock to a receiving device (refer to Patent Document 2). A data transmitting unit transmits data to the receiving device. A clock transmitting unit transmits a clock to the receiving device. A reception unit receives the data from the receiving device. A control unit controls the data transmission performed by the data transmitting unit, and the clock transmission performed by the clock transmitting unit. The control unit makes the data transmitting unit transmit, to the receiving device at a predetermined timing, each of ordinary data, calibration data for detecting a data reception state or a clock reception state in the receiving device, calibration start instruction data which instructs the receiving device to start the transmission of the calibration data, and transmission instruction data which instructs the receiving device to transmit calibration sample data which is obtained when the receiving device samples the calibration data. When the reception unit receives the calibration sample data transmitted from the receiving device, the control unit performs control, based on the received calibration sample data, any one or more of adjustment of a phase between the data transmitted by the data transmitting unit and the clock transmitted by the clock transmitting unit, adjustment of an amplitude of the data transmitted by the data transmitting unit, adjustment of a duty of the data transmitted by the data transmitting unit, and adjustment of a duty of the clock transmitted by the clock transmitting unit.

Patent Document 1: Japanese Laid-open Patent Publication No. 2011-90361
Patent Document 2: Japanese Laid-open Patent Publication No. 2011-91745

When a clock signal is delayed, a phase of the clock signal is shifted with respect to data. When the phase-shifted data is transmitted, an occurrence rate of a reception error increases. In particular, the occurrence rate of the reception error increases when a frequency of the clock signal becomes high.

SUMMARY

A transmission circuit includes: a clock generating circuit configured to generate a first clock signal and a second clock signal whose frequency is lower than a frequency of the first clock signal; a first conversion circuit configured to convert, based on the second clock signal, input data into intermediate data whose bit width is narrower than a bit width of the input data; a second conversion circuit configured to convert, based on the first clock signal, the intermediate data into output data whose bit width is narrower than the bit width of the intermediate data; capture circuits configured to sequentially capture a data sequence of the output data; an analysis circuit configured to perform an analysis on the captured data sequence; and a phase adjusting circuit configured to adjust a phase of the second clock signal based on a result of the analysis.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a diagram illustrating an operation example of a multiplexer;

FIG. 4A and FIG. 4B are diagrams each illustrating an operation example of the multiplexer;

FIG. 8 is a flow chart illustrating a control method of a control block;

DESCRIPTION OF EMBODIMENTS

Figure 1:
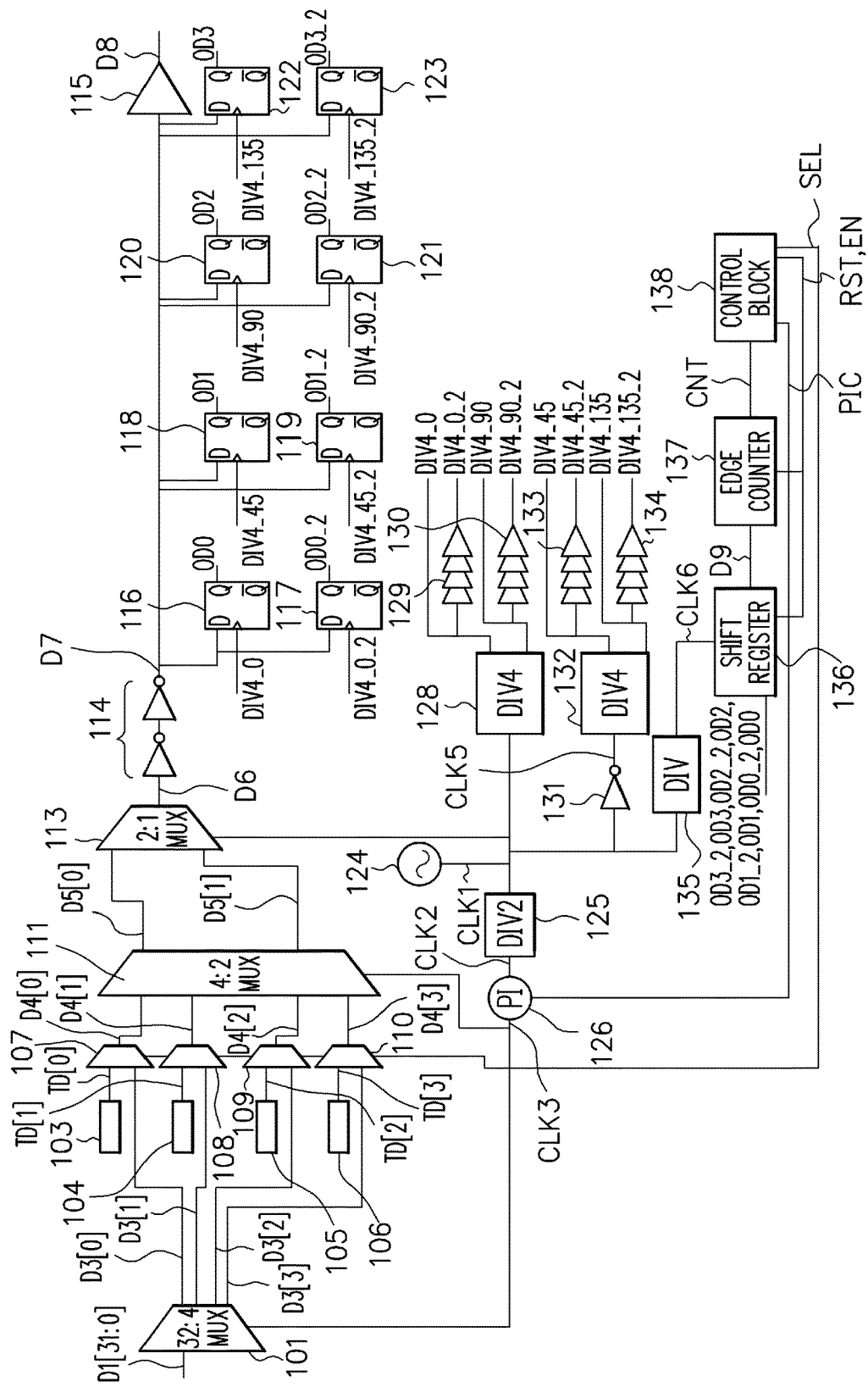
FIG. 1 is a diagram illustrating a configuration example of a transmission circuit according to the present embodiment.

FIG. 1 is a diagram illustrating a configuration example of a transmission circuit according to the present embodiment. The transmission circuit converts 32-bit parallel transmission data D1[31:0] into serial transmission data D8, and transmits the serial transmission data D8.

A voltage control oscillator (VCO) 124 generates a first clock signal CLK1. A frequency of the first clock signal CLK1 is 28 GHz, for example. A 2-frequency divider 125 divides the frequency of the first clock signal CLK1 by two to generate a second clock signal CLK2. The second clock signal CLK2 has a frequency of 14 GHz, for example, and is formed of four-phase clock signals. The frequency of the second clock signal CLK2 is lower than the frequency of the first clock signal CLK1, and is ½ of the frequency of the first clock signal CLK1. A phase adjusting circuit 126 is, for example, a phase interpolation circuit, and adjusts a phase of a second clock signal CLK3 based on the second clock signal CLK2, in accordance with a phase code PIC. The second clock signal CLK3 is formed of four-phase clock signals, including a clock signal CLK3(0°) of 0°, a clock signal CLK3(90°) of 90°, a clock signal CLK3(180°) of 180°, and a clock signal CLK3(270°) of 270°. A frequency of the second clock signal CLK3 is the same as the frequency of the second clock signal CLK2. The voltage control oscillator 124 and the 2-frequency divider 125 correspond to a clock generating circuit configured to generate the first clock signal CLK1 and the second clock signal CLK2.

A multiplexer 101 multiplexes the 32-bit parallel transmission data D1[31:0] in synchronization with the second clock signals) CLK3(0°) and CLK3(90°), to thereby generate 4-bit parallel transmission data D3[0] to D3[3]. Specifically, the multiplexer 101 converts the 32-bit parallel transmission data D1[31:0] into the 4-bit parallel transmission data D3[0] to D3[3], based on the second clock signals CLK3(0°) and CLK3(90°). A bit width of the 4-bit parallel transmission data D3[0] to D3[3] is narrower than a bit width of the 32-bit parallel transmission data D1[31:0].

A test data generating circuit 103 generates high-level 1-bit test data TD[0] indicating a fixed value "1". A test data generating circuit 104 generates low-level 1-bit test data TD[1] indicating a fixed value "0". A test data generating circuit 105 generates low-level 1-bit test data TD[2] indicating a fixed value "0". A test data generating circuit 106 generates high-level 1-bit test data TD[3] indicating a fixed value "1".

Figure 2A:
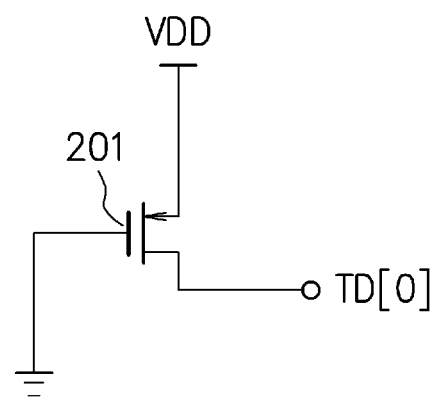
FIG. 2A and FIG. 2B are diagrams each illustrating a configuration example of a test data generating circuit.

FIG. 2A is a diagram illustrating a configuration example of the test data generating circuit 103 in FIG. 1. The test data generating circuit 103 includes a p-channel field effect transistor 201, and generates the high-level 1-bit test data TD[0] indicating the value "1". The p-channel field effect transistor 201 has a source connected to a node of power supply potential VDD, a gate connected to a node of ground potential, and a drain connected to a node of the 1-bit test data TD[0]. The p-channel field effect transistor 201 is turned on since the gate thereof is at the ground potential. As a result of this, the 1-bit test data TD[0] is fixed to a high level indicating the value "1". The test data generating circuit 106 has a configuration similar to the configuration of the test data generating circuit 103, and generates the high-level 1-bit test data TD[3] indicating the value "1".

Figure 2B:
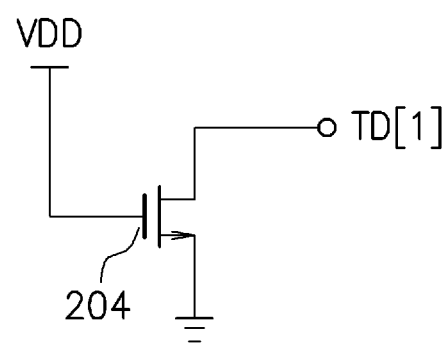

FIG. 2B is a diagram illustrating a configuration example of the test data generating circuit 104 in FIG. 1. The test data generating circuit 104 includes an n-channel field effect transistor 204, and generates the low-level 1-bit test data TD[1] indicating the value "0". The re-channel field effect transistor 204 has a source connected to a node of ground potential, a gate connected to a node of power supply potential VDD, and a drain connected to a node of the 1-bit test data TD[1]. The n-channel field effect transistor 204 is turned on since the gate thereof is at the power supply potential VDD. As a result of this, the 1-bit test data TD[1] is fixed to a low level indicating the value "0". The test data generating circuit 105 has a configuration similar to the configuration of the test data generating circuit 104, and generates the low-level 1-bit test data TD[2] indicating the value "0".

In FIG. 1, a control block 138 outputs a selection signal SEL indicating a phase adjustment mode or a transmission mode, to selectors 107 to 110. The selector 107 selects the 1-bit test data TD[0] when the selection signal SEL indicates the phase adjustment mode, selects the 1-bit transmission data D3[0] when the selection signal SEL indicates the transmission mode, and outputs the selected data as 1-bit transmission data D4[0].

The selector 108 selects the 1-bit test data TD[1] when the selection signal SEL indicates the phase adjustment mode, selects the 1-bit transmission data D3[1] when the selection signal SEL indicates the transmission mode, and outputs the selected data as 1-bit transmission data D4[1].

The selector 109 selects the 1-bit test data TD[2] when the selection signal SEL indicates the phase adjustment mode, selects the 1-bit transmission data D3[2] when the selection signal SEL indicates the transmission mode, and outputs the selected data as 1-bit transmission data D4[2].

The selector 110 selects the 1-bit test data TD[3] when the selection signal SEL indicates the phase adjustment mode, selects the 1-bit transmission data D3[3] when the selection signal SEL indicates the transmission mode, and outputs the selected data as 1-bit transmission data D4[3].

Specifically, the selectors 107 to 110 select the 4-bit test data TD[0] to TD[3] when the selection signal SEL indicates the phase adjustment mode, select the 4-bit transmission data D3[0] to D3[3] when the selection signal SEL indicates the transmission mode, and output the selected data as the 4-bit transmission data D4[0] to D4[3].

First, in the phase adjustment mode, the transmission circuit decides a phase adjustment amount in the phase adjusting circuit 126. Thereafter, in the transmission mode, the transmission circuit fixes the phase adjustment amount, and converts the 32-bit parallel transmission data D1[31:0] into the serial transmission data D8.

A multiplexer 111 multiplexes the 4-bit parallel transmission data D4[0] to D4[3] in synchronization with the second clock signals) CLK3(0°) and CLK3(90°), to thereby generate 2-bit parallel transmission data D5[0] and D5[1]. The multiplexer 111 corresponds to a first conversion circuit, and converts the 4-bit parallel transmission data (input data) D4[0] to D4[3] into the 2-bit parallel transmission data (intermediate data) D5[0] and D5[1], based on the second clock signal CLK3. A bit width of the 2-bit parallel transmission data D5[0] and D5[1] is narrower than a bit width of the 4-bit parallel transmission data D4[0] to D4[3].

FIG. 3 is a diagram illustrating an operation example of the multiplexer 111 in FIG. 1, and illustrates an operation example in the phase adjustment mode. The selectors 107 to 110 select the test data TD[0] to TD[3]. The transmission data D4[0] is the same as the test data TD[0] which is fixed to a high level and indicates the value "1". The transmission data D4[1] is the same as the test data TD[1] which is fixed to a low level and indicates the value "0". The transmission data D4[2] is the same as the test data TD[2] which is fixed to a low level and indicates the value "0". The transmission data D4[3] is the same as the test data TD[3] which is fixed to a high level and indicates the value "1".

A frequency of the second clock signal CLK3 is 14 GHz, for example. A one-bit period of the serial transmission data D8 in FIG. 1 is 1 unit interval (UI), and one cycle of the second clock signal CLK3 is 4 UI.

When the second clock signal CLK3(0°) is in a period of high level, the multiplexer 111 outputs the transmission data D4[0] as the transmission data D5[0]. When the second clock signal CLK3(0°) is in a period of low level, the multiplexer 111 outputs the transmission data D4[1] as the transmission data D5[0]. The transmission data D4[0] is fixed to a high level, and the transmission data D4[1] is fixed to a low level, so that the transmission data D5[0] repeatedly takes a pattern of "101010".

When the second clock signal CLK3(90°) is in a period of high level, the multiplexer 111 outputs the transmission data D4[2] as the transmission data D5[1]. When the second clock signal CLK3(90°) is in a period of low level, the multiplexer 111 outputs the transmission data D4[3] as the transmission data D5[1]. The transmission data D4[2] is fixed to a low level, and the transmission data D4[3] is fixed to a high level, so that the transmission data D5[1] repeatedly takes a pattern of "101010".

In FIG. 1, a multiplexer 113 multiplexes the 2-bit parallel transmission data D5[0] and D5[1] in synchronization with the first clock signal CLK1, to thereby generate serial transmission data D6. Specifically, the multiplexer 113 corresponds to a second conversion circuit, and converts, based on the first clock signal CLK1, the 2-bit parallel transmission data (intermediate data) D5[0] and D5[1] into the serial transmission data (output data) D6. A bit width of the serial transmission data D6 is narrower than the bit width of the 2-bit parallel transmission data D5[0] and D5[1].

A pre-driver circuit 114 makes the serial transmission data D6 input therein, and outputs serial transmission data D7. A driver circuit 115 makes the serial transmission data D7 input therein, and outputs the serial transmission data D8.

FIG. 4A is a diagram illustrating an operation example of the multiplexer 113 in FIG. 1, and illustrates an operation example in the phase adjustment mode. The selectors 107 to 110 select the test data TD[0] to TD[3]. The transmission data D5[0] is the same as the transmission data D5[0] in FIG. 3, and repeatedly takes a pattern of "101010". The transmission data D5[1] is the same as the transmission data D5[1] in FIG. 3, and repeatedly takes a pattern of "101010".

The frequency of the first clock signal CLK1 is 28 GHz, for example. A one-bit period of the serial transmission data D6 is 1 UI, and one cycle of the first clock signal CLK1 is 2 UI.

When the first clock signal CLK1 is in a period of high level, the multiplexer 113 outputs the transmission data D5[0] as the transmission data D6. When the first clock signal CLK1 is in a period of low level, the multiplexer 113 outputs the transmission data D5[1] as the transmission data D6. The transmission data D5[0] repeatedly takes a pattern of "1010", and the transmission data D5[1] repeatedly takes a pattern of "1010", so that the transmission data D6 repeatedly takes a pattern of "11001100". A pulse width of the transmission data D6 is constant to be 2 UI in every cycle. Within 4 UI of the transmission data D6, an edge number is one.

In FIG. 4A, a phase of the transmission data D5[0], D5[1] coincides with a phase of the first clock signal CLK1. Next, description will be made on a case where the phase of the transmission data D5[0], D5[1] is shifted with respect to the phase of the first clock signal CLK1, while referring to FIG. 4B.

FIG. 4B is a diagram illustrating an operation example of the multiplexer 113 when the phase of the transmission data D5[0], D5[1] is shifted with respect to the phase of the first clock signal CLK1. The phase of the transmission data D5[0] and 05[1] in FIG. 4B is shifted with respect to the phase of the transmission data D5[0] and D5[1] in FIG. 4A. When the first clock signal CLK1 is in a period of high level, the multiplexer 113 outputs the transmission data D5[0] as the transmission data D6. When the first clock signal CLK1 is in a period of low level, the multiplexer 113 outputs the transmission data D5[1] as the transmission data D6. The transmission data D5[0] repeatedly takes a pattern of "1010". The transmission data D5[1] repeatedly takes a pattern of "1010". However, the transmission data D6 includes a cycle in which a pulse width is 1 UI, and a cycle in which a pulse width is 0.5 UI. Within 4 UI of the transmission data D6, an edge number is five. The transmission data D6 includes a cycle in which a data transition occurs in the vicinity of the middle of the period of 1 UI, and thus an occurrence rate of a bit error increases.

As described above, the transmission data D6 in FIG. 4A is data obtained when the phase relationship between the transmission data D5[0], D5[1] and the first clock signal CLK1 is normal. On the contrary, the transmission data D6 in FIG. 4B is data obtained when the phase relationship between the transmission data D5[0], D5[1] and the first clock signal CLK1 is abnormal.

Specifically, the transmission data D6 in FIG. 4A is data obtained when the phase of the second clock signal CLK3 to be adjusted by the phase adjusting circuit 126 is normal. On the contrary, the transmission data D6 in FIG. 4B is data obtained when the phase of the second clock signal CLK3 to be adjusted by the phase adjusting circuit 126 is abnormal. Therefore, when the abnormal transmission data D6 in FIG. 4B is obtained, by adjusting the phase of the second clock signal CLK3 with the use of the phase adjusting circuit 126, it is possible to obtain the normal transmission data D6 in FIG. 4A. Hereinafter, detailed description thereof will be made.

Figure 5A:
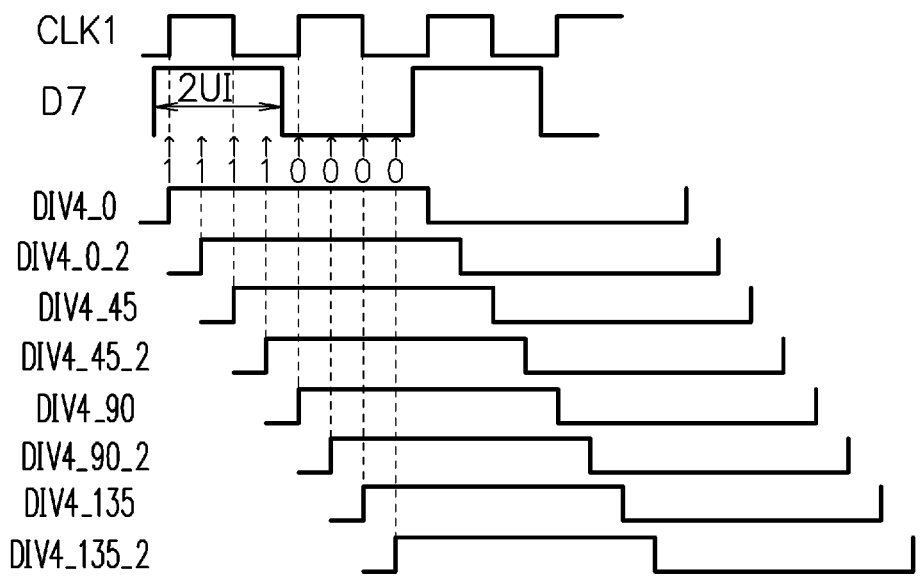
FIG. 5A and FIG. 5B are diagrams each illustrating an operation example of D-type flip-flop circuits.

In FIG. 1, a 4-frequency divider 128 divides the frequency of the first clock signal CLK1 by four, to thereby generate a clock signal DIV4_0 of 0° and a clock signal DIV4_90 of 90° as illustrated in FIG. 5A. A frequency of the clock signals DIV4_0 and DIV4_90 is 7 GHz, for example. The frequency of the clock signals DIV4_0 and DIV4_90 is lower than the frequency of the first clock signal CLK1, and is ¼ of the frequency of the first clock signal CLK1. A phase difference between the clock signals DIV4_0 and DIV4_90 is 2 UI.

An inverter 131 generates a clock signal CLK5 which is obtained by performing logical conversion on the first clock signal CLK1. A 4-frequency divider 132 divides a frequency of the clock signal CLK5 by four, to thereby generate a clock signal DIV4_45 of 45° and a clock signal DIV4_135 of 135°, as illustrated in FIG. 5A. A frequency of the clock signals DIV4_45 and DIV4_135 is 7 GHz, for example. The frequency of the clock signals DIV4_45 and DIV4_135 is lower than the frequency of the first clock signal CLK1, and is ¼ of the frequency of the first clock signal CLK1. A phase difference between the clock signals DIV4_45 and DIV4_135 is 2 UI. A phase difference between the clock signals DIV4_0 and DIV4_45 is 1 UI.

A delay circuit 129 delays the clock signal DIV4_0, to generate a clock signal DIV4_0_2 of 22.5°. A delay circuit 130 delays the clock signal DIV4_90, to generate a clock signal DIV4_90_2 of 112.5°. A delay circuit 133 delays the clock signal DIV4_45, to generate a clock signal DIV4_45_2 of 67.5°. A delay circuit 134 delays the clock signal DIV4_135, to generate a clock signal DIV4_135_2 of 157.5°. A delay time of the delay circuits 129, 130, 133, 134 is 0.5 UI, which is shorter than 1 UI. These eight clock signals DIV4_0 to DIV4_135_2 are eight-phase clock signals, as illustrated in FIG. 5A.

FIG. 5A is a diagram illustrating an operation example of D-type flip-flop circuits 116 to 123 in FIG. 1, and illustrates an operation example of the normal case in FIG. 4A. The transmission data D7 has a logical value same as a logical value of the normal transmission data D6 in FIG. 4A.

The D-type flip-flop circuit 116 latches the transmission data D7 in synchronization with a rising edge of the clock signal DIV4_0, and outputs the latched data as data OD0. The data OD0 has a value "1".

The D-type flip-flop circuit 117 latches the transmission data D7 in synchronization with a rising edge of the clock signal DIV4_0_2, and outputs the latched data as data OD0_2. The data OD0_2 has a value "1".

The D-type flip-flop circuit 118 latches the transmission data D7 in synchronization with a rising edge of the clock signal DIV4_45, and outputs the latched data as data OD1. The data OD1 has a value "1".

The D-type flip-flop circuit 119 latches the transmission data D7 in synchronization with a rising edge of the clock signal DIV4_45_2, and outputs the latched data as data OD1_2. The data OD1_2 has a value "1".

The D-type flip-flop circuit 120 latches the transmission data D7 in synchronization with a rising edge of the clock signal DIV4_90, and outputs the latched data as data OD2. The data OD2 has a value "0".

The D-type flip-flop circuit 121 latches the transmission data D7 in synchronization with a rising edge of the clock signal DIV4_90_2, and outputs the latched data as data OD2_2. The data OD2_2 has a value "0".

The D-type flip-flop circuit 122 latches the transmission data D7 in synchronization with a rising edge of the clock signal DIV4_135, and outputs the latched data as data OD3. The data OD3 has a value "0".

The D-type flip-flop circuit 123 latches the transmission data D7 in synchronization with a rising edge of the clock signal DIV4_135_2, and outputs the latched data as data OD3_2. The data OD3_2 has a value "0".

As described above, the D-type flip-flop circuits 116 to 123 correspond to capture circuits configured to sequentially capture a data sequence of the transmission data D7. The data sequence of 4 UI of the transmission data D7 is "1100". The D-type flip-flop circuits 116 to 123 perform the capturing at eight different timings within 4 UI of the data sequence of the transmission data D7. Specifically, the D-type flip-flop circuits 116 to 123 perform the capturing at two different timings within 1 UI of the data sequence of the transmission data D7.

Figure 5B:
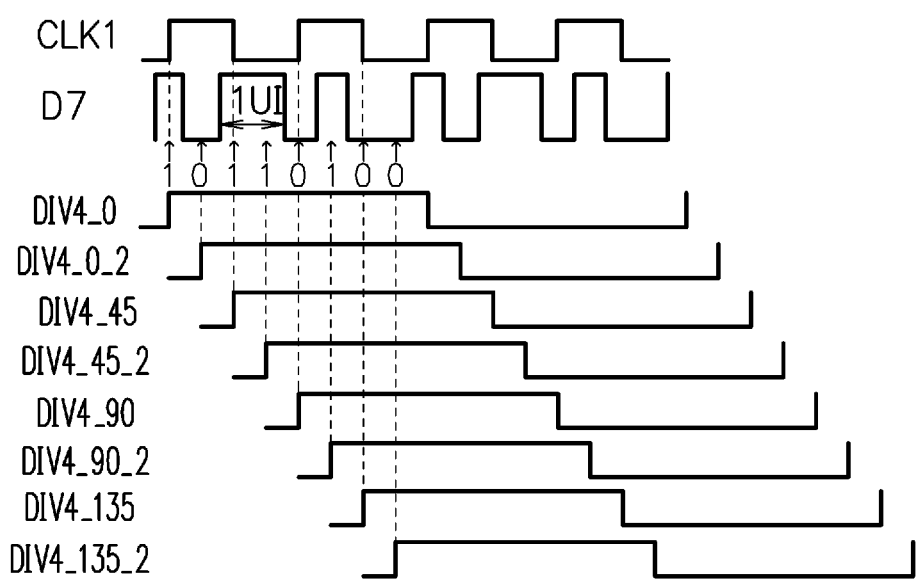

FIG. 5B is a diagram illustrating an operation example of the D-type flip-flop circuits 116 to 123 in the abnormal case in FIG. 4B. The transmission data D7 has a logical value same as a logical value of the abnormal transmission data D6 in FIG. 4B.

The D-type flip-flop circuit 116 latches the transmission data D7 in synchronization with a rising edge of the clock signal DIV40, and outputs the latched data as data OD0. The data OD0 has a value "1".

The D-type flip-flop circuit 117 latches the transmission data D7 in synchronization with a rising edge of the clock signal DIV4_0_2, and outputs the latched data as data OD0_2. The data OD0_2 has a value "0".

The D-type flip-flop circuit 118 latches the transmission data D7 in synchronization with a rising edge of the clock signal DIV4_45, and outputs the latched data as data OD1. The data OD1 has a value "1".

The D-type flip-flop circuit 119 latches the transmission data D7 in synchronization with a rising edge of the clock signal DIV4_45_2, and outputs the latched data as data OD1_2. The data OD1_2 has a value "1".

The D-type flip-flop circuit 120 latches the transmission data D7 in synchronization with a rising edge of the clock signal DIV4_90, and outputs the latched data as data OD2. The data OD2 has a value "0".

The D-type flip-flop circuit 121 latches the transmission data D7 in synchronization with a rising edge of the clock signal DIV4_90_2, and outputs the latched data as data OD2_2. The data OD2_2 has a value "1".

The D-type flip-flop circuit 122 latches the transmission data D7 in synchronization with a rising edge of the clock signal DIV4_135, and outputs the latched data as data OD3. The data OD3 has a value "0".

The D-type flip-flop circuit 123 latches the transmission data D7 in synchronization with a rising edge of the clock signal DIV4_135_2, and outputs the latched data as data OD3_2. The data OD3_2 has a value "0".

In FIG. 1, a frequency divider 135 outputs a clock signal CLK6 which is obtained by dividing the frequency of the first clock signal CLK1, to a shift register 136. In synchronization with the clock signal CLK6, the shift register 136 latches and shifts a sequence of the data OD0, OD0_2, OD1, OD1_2, OD2, OD2_2, OD3, OD3_2, to thereby output a data sequence D9. The data sequence D9 is the sequence of the data OD0, OD0_2, OD1, OD1_2, OD2, OD2_2, OD3, OD3_2. An edge counter 137 detects an edge number CNT of the data sequence D9. The control block 138 decides the phase code PIC based on the edge number CNT. The phase adjusting circuit 126 adjusts the phase of the second clock signal CLK3 based on the phase code PIC.

Figure 6:
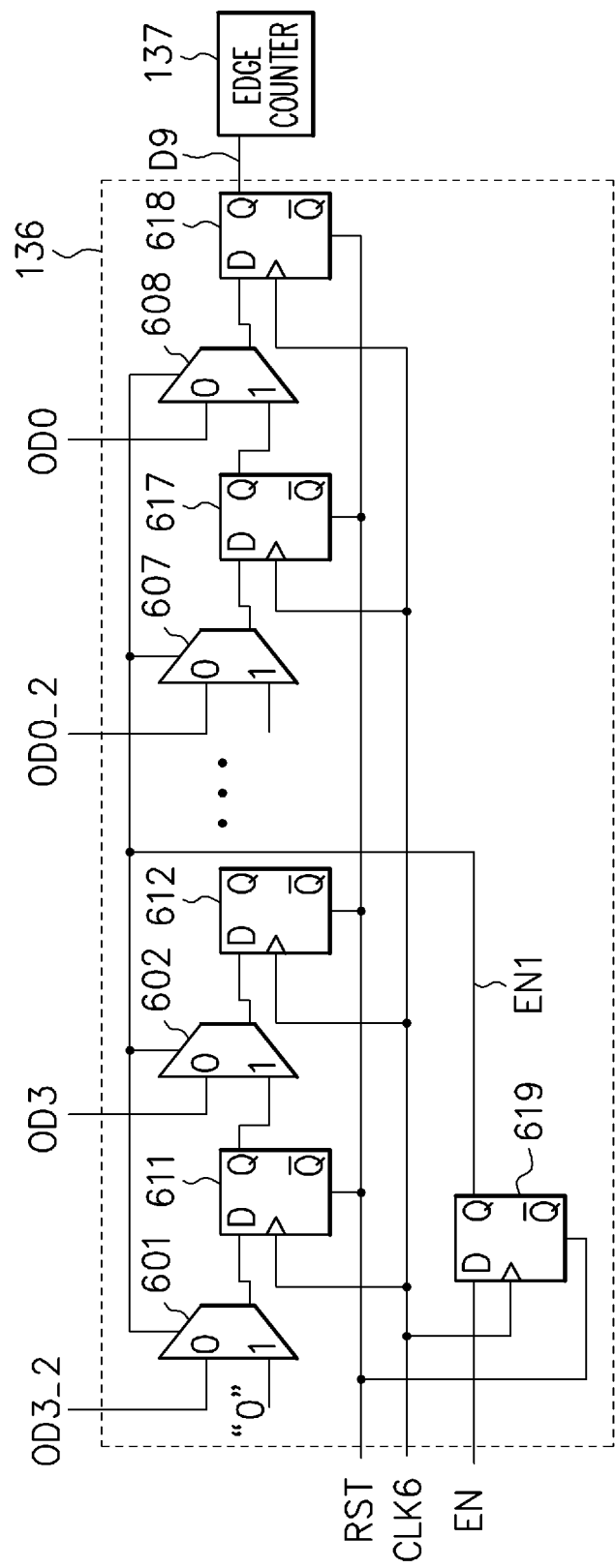
FIG. 6 is a diagram illustrating a configuration example of a shift register.

FIG. 6 is a diagram illustrating a configuration example of the shift register 136 in FIG. 1. The shift register 136 includes eight selectors 601 to 608, and nine D-type flip-flop circuits 611 to 619. The eight selectors 601 to 608 make eight pieces of data OD3_2, OD3, OD2_2, OD2, OD1_2, OD1, OD0_2, OD0 input therein, respectively.

In the phase adjustment mode, the control block 138 outputs a high-level reset signal RST. Consequently, a storage value of the D-type flip-flop circuits 611 to 619 is reset to 0. Next, the control block 138 outputs a low-level reset signal RST, to thereby cancel the reset state of the D-type flip-flop circuits 611 to 619.

Next, the control block 138 outputs a low-level enable signal EN to the D-type flip-flop circuit 619. Consequently, the D-type flip-flop circuit 619 latches the low-level enable signal EN in synchronization with the clock signal CLK6, and outputs a low-level enable signal EN1 to the selectors 601 to 608. Consequently, the selectors 601 to 608 output the data OD3_2, OD3, OD2_2, OD2, OD1_2, OD1, OD0_2, OD0 to input terminals D of the D-type flip-flop circuits 611 to 618, respectively. The D-type flip-flop circuits 611 to 618 latch the data OD3_2, OD3, OD2_2, OD2, OD1_2, OD1, OD0_2, OD0 in synchronization with the clock signal CLK6, and output the data OD3_2, OD3, OD2_2, OD2, OD1_2, OD1, OD0_2, OD0 from output terminals Q, respectively.

Next, the control block 138 outputs a high-level enable signal EN to the D-type flip-flop circuit 619. Consequently, the D-type flip-flop circuit 619 latches the high-level enable signal EN in synchronization with the clock signal CLK6, and outputs a high-level enable signal EN1 to the selectors 601 to 608. Consequently, the selector 601 outputs a value "0" to the input terminal D of the D-type flip-flop circuit 611. The D-type flip-flop circuit 611 latches the value "0" in synchronization with the clock signal CLK6, and outputs the value "0" from the output terminal Q.

The selectors 602 to 608 output the data OD3_2, OD3, OD2_2, OD2, OD1_2, OD1, OD0_2 output from the output terminals Q of the D-type flip-flop circuits 611 to 617, to the input terminals D of the D-type flip-flop circuits 612 to 618, respectively. The D-type flip-flop circuits 612 to 618 latch the data OD3_2, OD3, OD2_2, OD2, OD1_2, OD1, OD0_2 in synchronization with the clock signal CLK6, and output the data OD3_2, OD3, OD2_2, OD2, OD1_2, OD1, OD0_2 from the output terminals Q, respectively.

Next, in synchronization with the clock signal CLK6, the D-type flip-flop circuits 613 to 618 latch and output the data OD3_2, OD3, OD2_2, OD2, OD1_2, OD1, respectively. Thereafter, in synchronization with the clock signal CLK6, the D-type flip-flop circuits 611 to 618 repeatedly perform the latching and the output. As a result of this, the flip-flop circuit 618 at a final stage outputs the sequence of the data OD0, OD0_2, OD1, OD1_2, OD2, OD2_2, OD3, OD3_2, as the data sequence D9. In the case of FIG. 5A, the data sequence D9 becomes "11110000". In the case of FIG. 5B, the data sequence D9 becomes "10110100".

Figure 7:
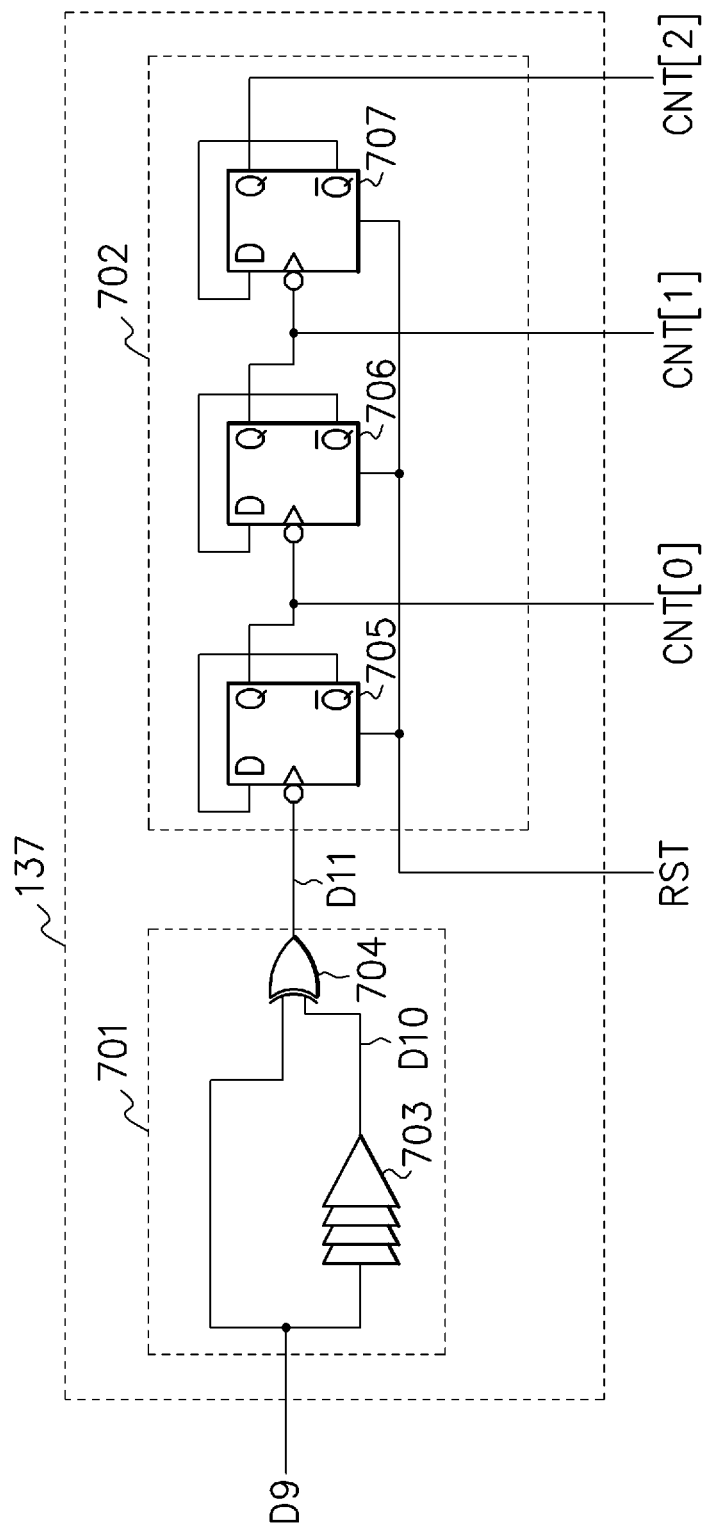
FIG. 7 is a diagram illustrating a configuration example of an edge counter.

FIG. 7 is a diagram illustrating a configuration example of the edge counter 137 in FIG. 1. The edge counter 137 includes an edge detector 701 and a 3-bit counter 702. The edge detector 701 includes a delay circuit 703 and an exclusive logical sum circuit 704. The delay circuit 703 outputs a data sequence D10 which corresponds to the data sequence D9 delayed by one data. The exclusive logical sum circuit 704 outputs an exclusive logical sum signal of the data sequences D9 and D10 as an edge signal D11. Concretely, when respective pieces of data of the data sequences D9 and D10 are the same, the exclusive logical sum circuit 704 outputs the edge signal D11 of "0", and when the respective pieces of data of the data sequences D9 and D10 are different, the exclusive logical sum circuit 704 outputs the edge signal D11 of "1". Specifically, the edge detector 701 outputs the edge signal D11 of "1" at a portion corresponding to an edge in the data sequence D9, and the edge detector 701 outputs the edge signal D11 of "0" at a portion which does not correspond to an edge in the data sequence D9.

The 3-bit counter 702 includes D-type flip-flop circuits 705 to 707. In the D-type flip-flop circuit 705, the edge signal D11 is input into a clock terminal, and an input terminal Q is connected to an inverting output terminal /Q. In the D-type flip-flop circuit 706, a clock terminal is connected to the output terminal Q of the D-type flip-flop circuit 705, and an input terminal Q is connected to an inverting output terminal /Q. In the D-type flip-flop circuit 707, a clock terminal is connected to the output terminal Q of the D-type flip-flop circuit 706, and an input terminal Q is connected to an inverting output terminal /Q. The output terminals Q of the D-type flip-flop circuits 705 to 707 output edge numbers CNT[0] to CNT[2], as a 3-bit count value. The edge numbers CNT[0] to CNT[2] correspond to an edge number CNT in FIG. 1.

The control block 138 outputs a high-level reset signal RST. Consequently, a storage value of the D-type flip-flop circuits 705 to 707 is reset to 0. Next, the control block 138 outputs a low-level reset signal RST. Consequently, the reset state of the D-type flip-flop circuits 705 to 707 is canceled. The D-type flip-flop circuits 705 to 707 respectively output "0" from the output terminals Q, and output "1" from the inverting output terminals /Q.

At a first edge, the edge signal D11 changes from "1" to "0", and the D-type flip-flop circuit 705 latches "1" at the input terminal D and outputs the edge number CNT[0] of "1". The D-type flip-flop circuit 706 outputs the edge number CNT[1] of "0". The D-type flip-flop circuit 707 outputs the edge number CNT[2] of "0".

At a second edge, the edge signal D11 changes from "1" to "0", and the D-type flip-flop circuit 705 latches "0" at the input terminal D and outputs the edge number CNT[0] of "0". The D-type flip-flop circuit 706 outputs the edge number CNT[1] of "1". The D-type flip-flop circuit 707 outputs the edge number CNT[2] of "0".

Similarly, at a third edge, each of the edge numbers CNT[0] and CNT[1] becomes "1", and the edge number CNT[2] becomes "0". The edge numbers CNT[0] to CNT[2] indicate a 3-bit count value of the edge in the data sequence D9. When the data sequence D9 is "11110000", as illustrated in FIG. 5A, the edge numbers CNT[0] to CNT[2] indicate 1. When the data sequence D9 is "10110100", as illustrated in FIG. 5B, the edge numbers CNT[0] to CNT[2] indicate 5.

FIG. 8 is a flow chart illustrating a control method of the control block 138 in FIG. 1. In step S801, the control block 138 sets the phase code PIC to 0. The phase adjusting circuit 126 adjusts the phase of the second clock signal CLK3, in accordance with the phase code PIC.

Next, in step S802, after a state of the transmission circuit is stabilized, the control block 138 resets the shift register 136 and the edge counter 137 with the use of the reset signal RST. Next, the control block 138 uses the enable signal EN to make the edge counter 137 start counting the edge number CNT.

Next, in step S803, the control block 138 judges whether or not the edge number CNT within 4 UI is 2 or less. When the edge number CNT is 2 or less, the control block 138 judges that the transmission data D7 at the phase code PIC is normal, as in FIG. 5A, and makes the processing proceed to step S804. On the contrary, when the edge number CNT is 3 or more, the control block 138 judges that the transmission data D7 at the phase code PIC is abnormal, as in FIG. 5B, and makes the processing proceed to step S805.

In step S804, the control block 138 sets 1 to a normal flag OK[PIC] of the phase code PIC, records the normal flag OK[PIC], and makes the processing proceed to step S806.

In step S805, the control block 138 sets 0 to the normal flag OK[PIC] of the phase code PIC, records the normal flag OK[PIC], and makes the processing proceed to step S806.

In step S806, the control block 138 judges whether or not the phase code PIC is a maximum code. Subsequently, when the phase code PIC is not the maximum code, the control block 138 makes the processing proceed to step S807, and when the phase code PIC is the maximum code, the control block 138 makes the processing proceed to step S808.

In step S807, the control block 138 increments the phase code PIC. The phase adjusting circuit 126 adjusts the phase of the second clock signal CLK3, in accordance with the phase code PIC. Thereafter, the control block 138 returns the processing to step S802, and repeatedly performs the processing from steps S802 to S806. Consequently, the control block 138 can set the normal flag OK[PIC] of every phase code PIC within one cycle of the second clock signal CLK3, as illustrated in FIG. 9.

In step S808, the control block 138 calculates a first phase code P1 and a second phase code P2, based on the normal flag OK[PIC]. Details thereof will be described while referring to FIG. 9.

Figure 9:
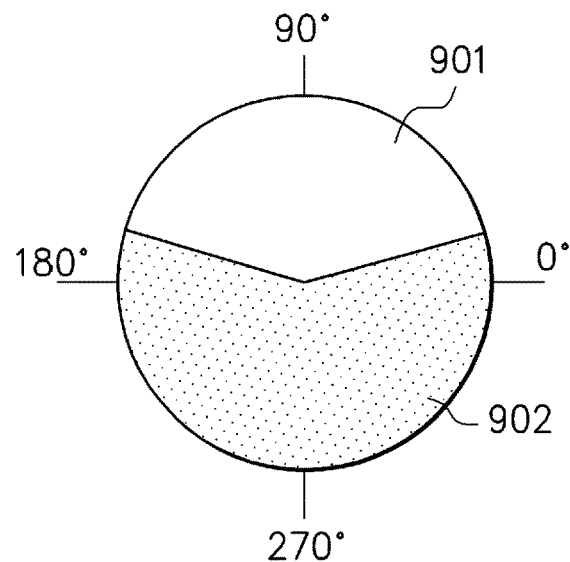
FIG. 9 is a diagram for explaining processing of the control block.

FIG. 9 is a diagram for explaining the processing in step S808 in FIG. 8. As described above, the control block 138 sets the normal flag OK[PIC] of every phase code PIC within one cycle of the second clock signal CLK3. For example, a phase range 901 is a normal phase range in which the normal flag OK[PIC] is set to 1. A phase range 902 is an abnormal phase range in which the normal flag OK[PIC] is set to 0. In this case, in order to decide a phase code PIC indicating a phase in the middle of the normal phase range 901, the control block 138 calculates the first phase code P1 and the second phase code P2 through the following method.

First, the control block 138 sets, between phase codes PIC at two boundaries between the phase range 901 in which the normal code OK[PIC] is 1 and the phase range 902 in which the normal code OK[PIC] is 0, a smaller phase code as a phase code CMIN, and a larger phase code as a phase code CMAX.

Next, the control block 138 calculates the following first data DEL1 and second data DEL2. Data MAX corresponds to the phase code PIC indicating the maximum phase within one cycle.

$$DEL1=(CMAX-CMIN)/2$$

$$DEL2=\{MAX-(CMAX-CMIN)\}/2$$

Next, the control block 138 calculates the following first phase code P1 and second phase code P2.

$$P1=CMIN+DEL1$$

$$P2\_1=CMIN-DEL2$$

$$P2\_2=CMAX+DEL2$$

$$P2=P2\_1, \text{when } P2\_2>MAX$$

$$P2=P2\_2, \text{when } P2\_2 \leq MAX$$

The first phase code P1 is a phase code indicating a phase in the middle of the phase range 901. The second phase code P2 is a phase code indicating a phase in the middle of the phase range 902. Note that at this moment, the control block 138 does not recognize that either of the phase ranges 901 and 902 is the normal phase range. Next, the control block 138 judges that either of the phase ranges 901 and 902 is the normal phase range. Subsequently, when the phase range 901 is the normal phase range, the control block 138 selects the first phase code P1, and when the phase range 902 is the normal phase range, the control block 138 selects the second phase code P2. Details thereof will be described below while referring to FIG. 10.

Figure 10:
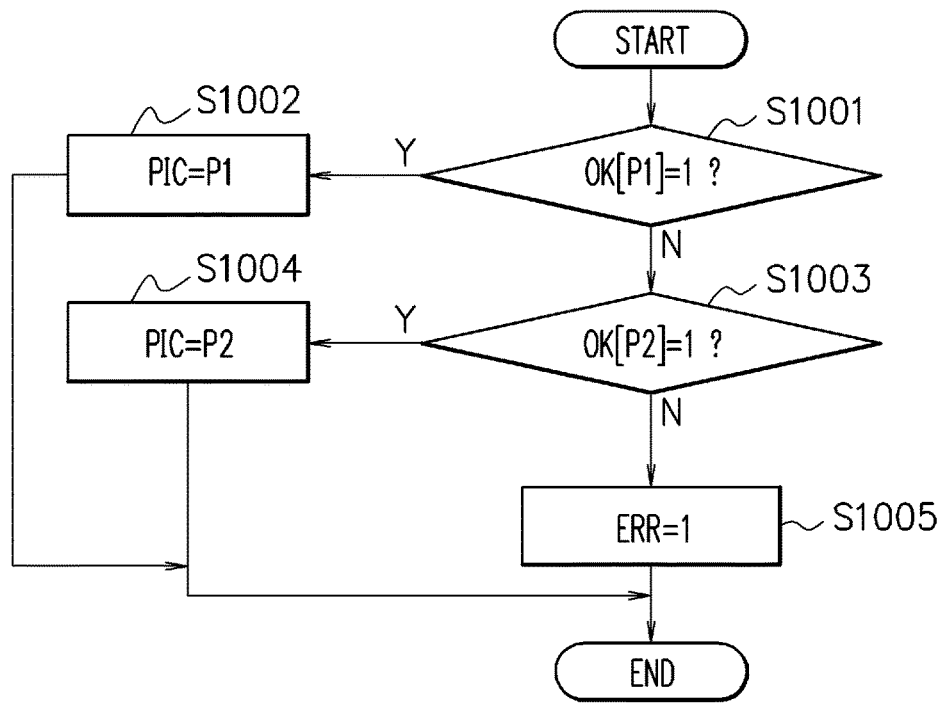
FIG. 10 is a flow chart illustrating a method in which the control block selects a first phase code or a second phase code.

FIG. 10 is a flow chart illustrating a method in which the control block 138 selects the first phase code P1 or the second phase code P2. In step S1001, the control block 138 judges whether or not a normal flag OK[P1] is 1. The first phase code P1 indicates the phase in the middle of the phase range 901. The normal flag OK[P1] is the normal flag OK[PIC] of the first phase code P1 which indicates the phase in the middle of the phase range 901. When the normal flag OK[P1] is 1, the control block 138 judges that the phase range 901 is the normal phase range, and makes the processing proceed to step S1002. On the contrary, when the normal flag OK[P1] is 0, the control block 138 judges that the phase range 901 is not the normal phase range, and makes the processing proceed to step S1003.

In step S1003, the control block 138 judges whether or not a normal flag OK[P2] is 1. The second phase code P2 indicates the phase in the middle of the phase range 902. The normal flag OK[P2] is the normal flag OK[PIC] of the second phase code P2 which indicates the phase in the middle of the phase range 902. When the normal flag OK[P2] is 1, the control block 138 judges that the phase range 902 is the normal phase range, and makes the processing proceed to step S1004. On the contrary, when the normal flag OK[P2] is 0, the control block 138 judges that the phase range 902 is not the normal phase range, and makes the processing proceed to step S1005.

In step S1002, the control block 138 sets the first phase code P1 to the phase code PIC, and terminates the processing. The phase adjusting circuit 126 adjusts the phase of the second clock signal CLK3, in accordance with the phase code PIC.

In step S1004, the control block 138 sets the second phase code P2 to the phase code PIC, and terminates the processing. The phase adjusting circuit 126 adjusts the phase of the second clock signal CLK3, in accordance with the phase code PIC.

In step S1005, the control block 138 sets 1 to an error flag ERR to notify an error, and terminates the processing.

As described above, the control block 138 sets the optimum phase code PIC in step S1002 or S1004. The phase adjusting circuit 126 adjusts the phase of the second clock signal CLK3 so that a phase code of the phase in the middle of the normal phase range 901 is obtained. Concretely, the phase adjusting circuit 126 adjusts the phase of the second clock signal CLK3 so that the edge number CNT becomes a threshold value or less (2 or less). Accordingly, as illustrated in FIG. 4A, the phases of the first clock signal CLK1 and the transmission data D5[0], D5[1] coincide, and it is possible to obtain the normal transmission data D6.

After the above-described phase adjustment mode, the control block 138 outputs the selection signal SEL indicating the transmission mode, to the selectors 107 to 110. Consequently, the selectors 107 to 110 output the transmission data D3[0] to D3[3] as the transmission data D4[0] to D4[3]. In the transmission mode, the transmission circuit converts the 32-bit parallel transmission data D1[31:0] into the serial transmission data D8, and transmits the serial transmission data D8. Since the phase adjustment is performed by the phase adjusting circuit 126, the phase of the serial transmission data D8 coincides with the phase of the first clock signal CLK1. This makes it possible to reduce a bit error (reception error) of the serial transmission data D8.

If, tentatively, the phase adjusting circuit 126 is not provided, the multiplexer 111 operates in synchronization with the second clock signal CLK2. In that case, since the second clock signal CLK2 is delayed relative to the first clock signal CLK1, the abnormal transmission data D6 is obtained, as illustrated in FIG. 4B, resulting in that a bit error increases.

There can be considered a method in which a user performs manual setting of the phase code PIC of the phase adjusting circuit 126 in accordance with environments, but, the method is complicated. According to the present embodiment, the control block 138 can automatically set the optimum phase code PIC.

Note that the test data TD[0] to TD[3] may be test data with which the transmission data D6 of 1100 or 0011 is obtained.

Figure 11A:
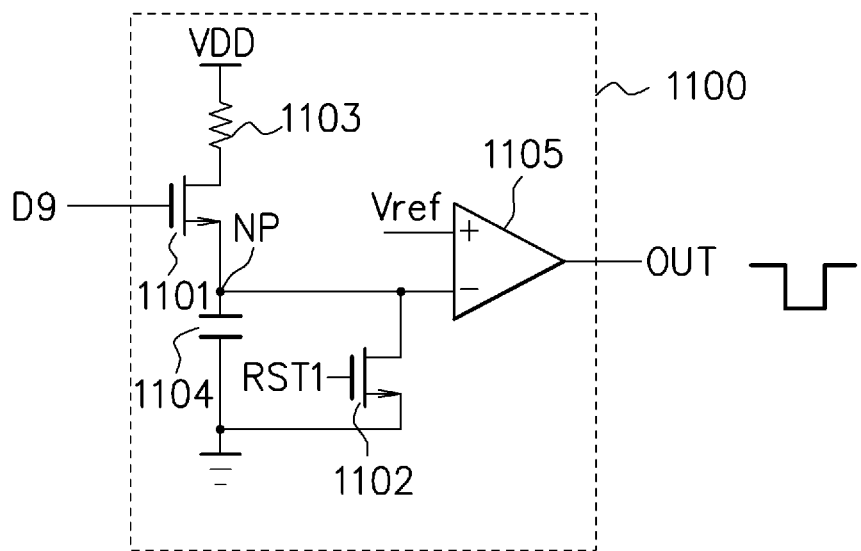
FIG. 11A to FIG. 11C are diagrams for explaining a pulse width detecting circuit.

FIG. 11A is a diagram illustrating a configuration example of a pulse width detecting circuit 1100 of a transmission circuit according to another embodiment. The pulse width detecting circuit 1100 is provided in place of the edge counter 137 in FIG. 1. The pulse width detecting circuit 1100 includes n-channel field effect transistors 1101, 1102, a resistor 1103, a capacitor 1104, and a comparator 1105, and detects a pulse width of the data sequence D9.

In the n-channel field effect transistor 1101, a drain is connected to a node of power supply potential VDD via the resistor 1103, the data sequence D9 is input into a gate, and a source is connected to a node NP. The capacitor 1104 is connected between the node NP and a node of ground potential. In the n-channel field effect transistor 1102, a drain is connected to the node NP, a reset signal RST1 is input into a gate, and a source is connected to the node of the ground potential. The comparator 1105 compares the potential of the node NP with a reference potential Vref, and outputs a result of the comparison as a pulse width signal OUT. When the potential of the node NP is lower than the reference potential Vref, the pulse width signal OUT becomes a high level. On the contrary, when the potential of the node NP is higher than the reference potential Vref, the pulse width signal OUT becomes a low level. The n-channel field effect transistor 1102 is turned on at predetermined intervals by the reset signal RST1, and resets the node NP to 0 V.

Figure 11B:
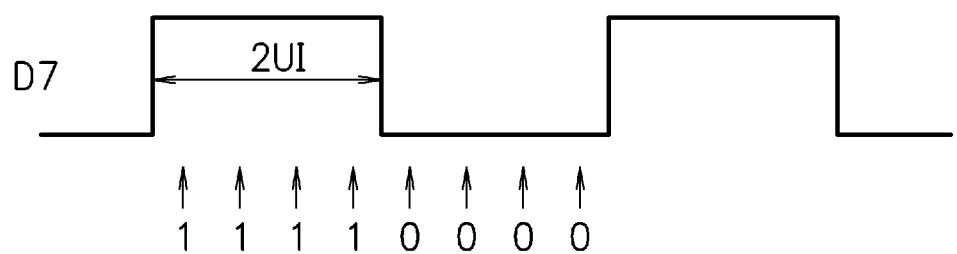
Figure 12:
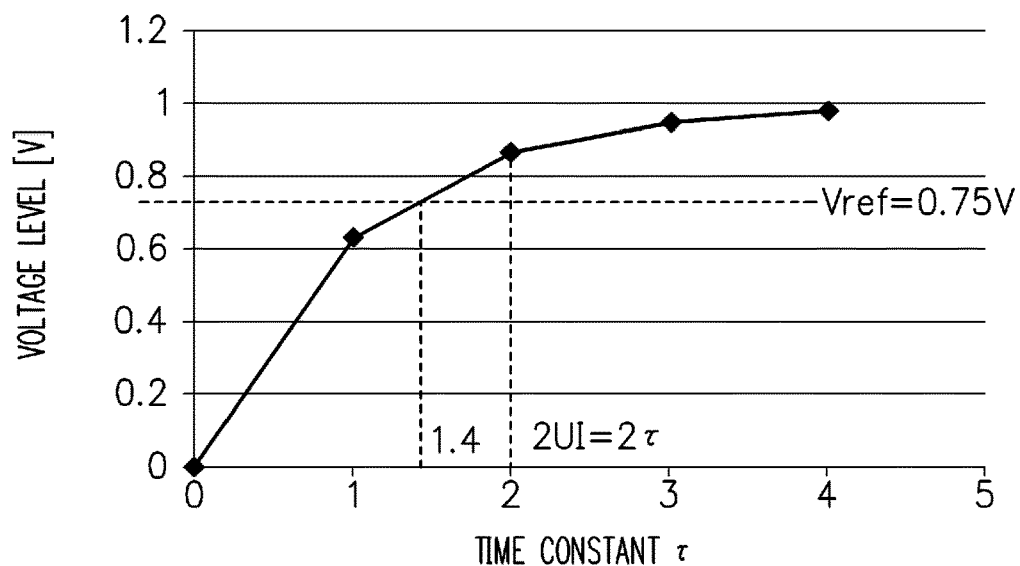
FIG. 12 is a graph illustrating an example of a voltage level of a node with respect to an RC time constant.

FIG. 11B is a diagram illustrating the normal serial transmission data D7, similarly to FIG. 5A. A pulse width of the serial transmission data D7 is 2 UI. In this case, the data sequence D9 becomes "11110000". When the pulse width of the data sequence D9 is 2 UI, the potential of the node NP becomes higher than the reference potential Vref, as illustrated in FIG. 12, resulting in that the pulse width signal OUT becomes a low level. When the pulse width signal OUT becomes a low level, the control block 138 judges that the transmission data D7 is normal, and sets 1 to the normal flag OK[PIC].

Figure 11C:
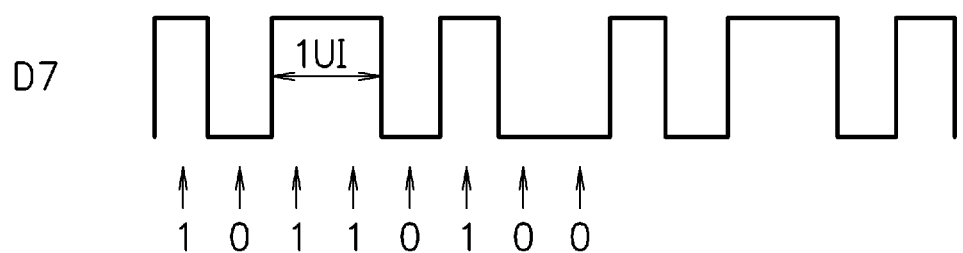

FIG. 11C is a diagram illustrating the abnormal serial transmission data D7, similarly to FIG. 5B. The serial transmission data D7 includes a pulse width of 1 UI and a pulse width of 0.5 UI. In this case, the data sequence D9 becomes "10110100". When the data sequence D9 includes the pulse widths of 1 UI and 0.5 UI, the potential of the node NP becomes lower than the reference potential Vref, as illustrated in FIG. 12, resulting in that the pulse width signal OUT maintains a high level. When the pulse width signal OUT is at a high level, the control block 138 judges that the transmission data D7 is abnormal, and sets 0 to the normal flag OK[PIC].

FIG. 12 is a graph illustrating an example of a voltage level of the node NP with respect to an RC time constant τ. Description will be made by citing a case where the RC time constant is 2 τ when the pulse width of the data sequence D9 is 2 UI, as an example. When the pulse width of the data sequence D9 is 1.4 UI, the node NP has 0.75 V. Therefore, the reference potential Vref is set to 0.75 V, for example. When the pulse width of the data sequence D9 is wider than 1.4 UI, the comparator 1105 outputs the pulse width signal OUT at a low level. On the contrary, when the pulse width of the data sequence D9 is narrower than 1.4 UI, the comparator 1105 outputs the pulse width signal OUT at a high level.

When the pulse width of the data sequence D9 is 2 UI, as in FIG. 11B, the comparator 1105 outputs the pulse width signal OUT at a low level for a period of time of 0.6 UI. Further, when the data sequence D9 includes the pulse widths of 1 UI and 0.5 UI, as in FIG. 11C, the comparator 1105 outputs the pulse width signal OUT at a high level.

As described above, each of the edge counter 137 in FIG. 1 and the pulse width detecting circuit 1100 corresponds to an analysis circuit configured to perform an analysis on the data sequence D9. The phase adjusting circuit 126 adjusts the phase of the second clock signal CLK3, based on a result of the analysis performed by the analysis circuit. For example, the phase adjusting circuit 126 adjusts the phase of the second clock signal CLK3 so that the pulse width of the data sequence D9 becomes wider than the threshold value (1.4 UI).

Figure 13:
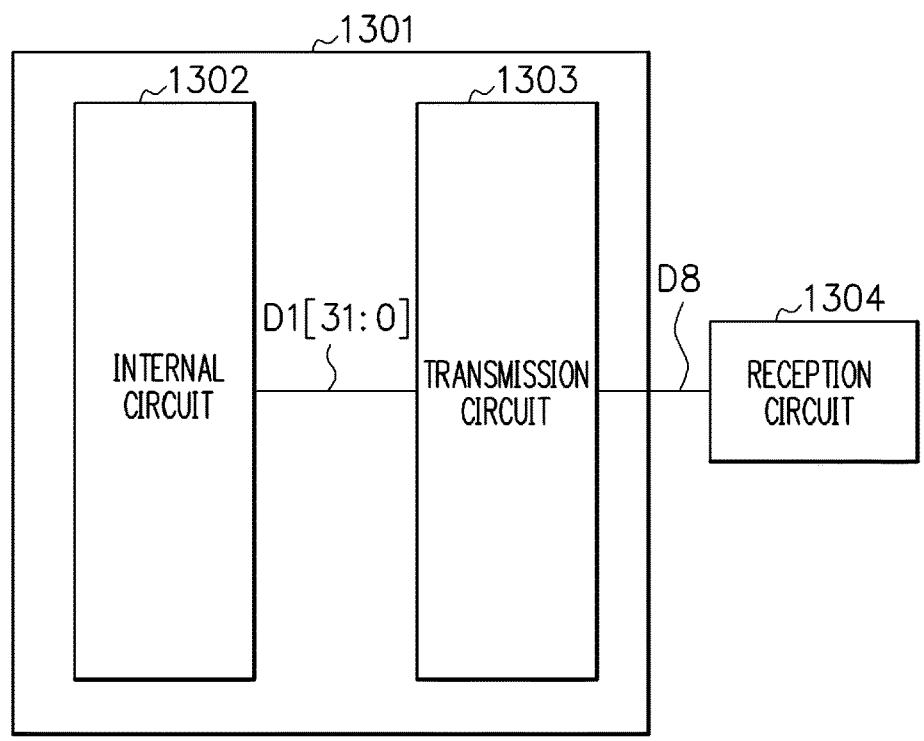
FIG. 13 is a diagram illustrating a configuration example of an integrated circuit and a reception circuit.

FIG. 13 is a diagram illustrating a configuration example of an integrated circuit 1301 and a reception circuit 1304. The integrated circuit 1301 includes an internal circuit 1302 and a transmission circuit 1303. The internal circuit 1302 generates the 32-bit parallel transmission data (internal data) D1[31:0]. The transmission circuit 1303, which is the transmission circuit in FIG. 1, receives the 32-bit parallel transmission data D1[31:0] from the internal circuit 1302, and outputs the serial transmission data D8 to the reception circuit 1304. The reception circuit 1304 includes a clock data recovery (CDR) circuit, and reproduces data and a clock signal based on the serial transmission data D8. As described above, since the phase adjusting circuit 126 of the transmission circuit performs the phase adjustment, the reception circuit 1304 can reduce an error of the data reproduction.

According to the present embodiment, it is possible to optimize a timing relationship between the second clock signal CLK3 and the transmission data D4[0] to D4[3] in the multiplexer 111, and a timing relationship between the first clock signal CLK1 and the transmission data D5[0], D5[1] in the multiplexer 113, to thereby prevent the occurrence of the bit error in the transmission data D6.

According to one aspect, it is possible to optimize a timing relationship between a second clock signal and input data in a first conversion circuit, and a timing relationship between a first clock signal and intermediate data in a second conversion circuit, to thereby prevent occurrence of a bit error in output data.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A transmission circuit, comprising:
a clock generating circuit configured to generate a first clock signal and a second clock signal whose frequency is lower than a frequency of the first clock signal;

a first conversion circuit configured to convert, based on the second clock signal, input data into intermediate data whose bit width is narrower than a bit width of the input data;

a second conversion circuit configured to convert, based on the first clock signal, the intermediate data into output data whose bit width is narrower than the bit width of the intermediate data;

capture circuits configured to sequentially capture a data sequence of the output data;

a detecting circuit configured to detect an edge number or a pulse width of the captured data sequence; and a phase adjusting circuit configured to adjust a phase of the second clock signal based on the detected edge number or pulse width.

2. The transmission circuit according to claim 1, wherein:
the detecting circuit is configured to detect the edge number of the captured data sequence; and
the phase adjusting circuit is configured to adjust the phase of the second clock signal based on the detected edge number.

3. The transmission circuit according to claim 1, wherein:
the detecting circuit is configured to detect the pulse width of the captured data sequence; and
the phase adjusting circuit is configured to adjust the phase of the second clock signal based on the detected pulse width.

4. The transmission circuit according to claim 1, wherein the capture circuits are configured to perform the capturing at a plurality of different timings within 1 UI of the data sequence of the output data.

5. The transmission circuit according to claim 1, further comprising
selectors configured to select transmission data or test data and output the selected data to the first conversion circuit as the input data, wherein
the phase adjusting circuit is configured to adjust the phase of the second clock signal when the selectors select the test data.

6. The transmission circuit according to claim wherein:
the detecting circuit is configured to detect the edge number or the pulse width of the captured data sequence in a phase range corresponding to one cycle of the second clock signal; and
the phase adjusting circuit is configured to adjust the phase of the second clock signal so that the phase of the second clock is in the middle of a normal phase range in which the detected edge number or pulse width being normal.

7. The transmission circuit according to claim 2, wherein the phase adjusting circuit is configured to adjust the phase of the second clock signal so that the detected edge number becomes equal to or less than a threshold value.

8. The transmission circuit according to claim 3, wherein the phase adjusting circuit is configured to adjust the phase of the second clock signal so that the detected pulse width becomes wider than a threshold value.

9. An integrated circuit, comprising:
an internal circuit configured to generate internal data; and
a transmission circuit configured to receive the internal data, wherein the transmission circuit includes:
a clock generating circuit configured to generate a first clock signal and a second clock signal whose frequency is lower than a frequency of the first clock signal;
a first conversion circuit configured to convert, base d on the second clock signal, input data into intermediate data whose bit width is narrower than a bit width of the input data;
a second conversion circuit configured to convert, based on the first clock signal, the intermediate data into output data whose bit width is narrower than the bit width of the intermediate data;
capture circuits configured to sequentially capture a data sequence of, the output data;
a detecting circuit configured to detect an edge number or a pulse width of the captured data sequence; and
a phase adjusting circuit configured to adjust a phase of the second clock signal based on the detected edge number or pulse width.

10. The integrated circuit according to claim 9, wherein
the detecting circuit is configured to detect the edge number of the captured data sequence; and
the phase adjusting circuit is configured to adjust the phase of the second clock signal based on the detected edge number.

11. The integrated circuit according to claim 9, wherein:
the detecting circuit is configured to detect the pulse width of the captured data sequence; and
the phase adjusting circuit is configured to adjust the phase of the second clock signal based on the detected pulse width.

12. The integrated circuit according to claim 9, wherein the capture circuits are configured to perform the capturing at a plurality of different timings within 1 UI of the data sequence of the output data.

13. The integrated circuit according to claim 9, wherein:
the transmission circuit further includes selectors configured to select transmission data or test data and output the selected data to the first conversion circuit as the input data; and
the phase adjusting circuit is configured to adjust the phase of the second clock signal when the selectors select the test data.

14. The integrated circuit according to claim 9, wherein:
the detecting circuit is configured to detect the edge number or the pulse width of the captured data sequence in a phase range corresponding to one cycle of the second clock signal; and
the phase adjusting circuit is configured to adjust the phase of the second clock signal so that the phase of the second clock signal is in the middle of a normal phase range in which the detected edge number or pulse width being normal.

15. The integrated circuit according to claim 10, wherein the phase adjusting circuit is configured to adjust the phase of the second clock signal so that the detected edge number becomes equal to or less than a threshold value.

16. The integrated circuit according to claim 11, wherein the phase adjusting circuit is configured to adjust the phase of the second clock signal so that the detected pulse width becomes wider than a threshold value.

\* \* \* \* \*